United States Patent
Schuegraf

Patent Number: 5,920,763
Date of Patent: Jul. 6, 1999

[54] METHOD AND APPARATUS FOR IMPROVING THE STRUCTURAL INTEGRITY OF STACKED CAPACITORS

[75] Inventor: Klaus F. Schuegraf, Boise, Id.

[73] Assignee: Micron Technology, Inc., Boise, Id.

[21] Appl. No.: 08/915,951

[22] Filed: Aug. 21, 1997

[51] Int. Cl.⁶ .............................................. H01L 21/8242
[52] U.S. Cl. ............................................. 438/3; 438/715
[58] Field of Search ........................... 438/244, 253, 438/387, 396, 584, 694; 257/303, 306; 156/345

[56] References Cited

U.S. PATENT DOCUMENTS

| | | |
|---|---|---|
| 4,481,283 | 11/1984 | Kerr et al. . |
| 4,821,085 | 4/1989 | Haken et al. . |
| 4,874,719 | 10/1989 | Kurosawa . |
| 5,006,481 | 4/1991 | Chan et al. . |
| 5,032,892 | 7/1991 | Chern et al. . |
| 5,037,773 | 8/1991 | Lee et al. . |
| 5,043,780 | 8/1991 | Fazan et al. . |
| 5,053,351 | 10/1991 | Fazan et al. . |
| 5,053,917 | 10/1991 | Miyasaka et al. . |
| 5,057,888 | 10/1991 | Fazan et al. . |
| 5,082,797 | 1/1992 | Chan et al. . |
| 5,089,986 | 2/1992 | Sandhu et al. . |
| 5,102,832 | 4/1992 | Tuttle . |
| 5,124,780 | 6/1992 | Sandhu et al. . |
| 5,126,280 | 6/1992 | Chan et al. . |
| 5,234,855 | 8/1993 | Rhodes et al. . |
| 5,236,860 | 8/1993 | Fazan et al. . |
| 5,262,343 | 11/1993 | Rhodes et al. . |
| 5,266,514 | 11/1993 | Tuan et al. . |
| 5,292,393 | 3/1994 | Maydan et al. ......................... 156/345 |
| 5,300,463 | 4/1994 | Cathey et al. . |
| 5,309,023 | 5/1994 | Motonami et al. . |
| 5,318,920 | 6/1994 | Hayashide . |
| 5,326,714 | 7/1994 | Liu et al. . |
| 5,330,928 | 7/1994 | Tseng ........................................ 437/52 |
| 5,340,763 | 8/1994 | Dennison . |
| 5,340,765 | 8/1994 | Dennison et al. . |
| 5,342,800 | 8/1994 | Jun . |
| 5,344,525 | 9/1994 | Cathey, Jr. . |
| 5,350,707 | 9/1994 | Ko et al. . |
| 5,366,590 | 11/1994 | Kadumura . |
| 5,366,917 | 11/1994 | Watanabe et al. . |
| 5,384,152 | 1/1995 | Chu et al. ................................. 427/81 |
| 5,401,681 | 3/1995 | Dennison ................................. 437/60 |
| 5,418,180 | 5/1995 | Brown ...................................... 437/60 |
| 5,420,074 | 5/1995 | Ohshima . |
| 5,420,449 | 5/1995 | Oji . |
| 5,434,812 | 7/1995 | Tseng ...................................... 365/149 |
| 5,444,013 | 8/1995 | Akram et al. . |
| 5,460,999 | 10/1995 | Hong et al. ............................. 437/60 |
| 5,489,544 | 2/1996 | Rajeevakumar . |
| 5,494,841 | 2/1996 | Dennison et al. . |
| 5,545,584 | 8/1996 | Wuu et al. . |
| 5,573,968 | 11/1996 | Park ........................................ 437/52 |
| 5,580,821 | 12/1996 | Mathews et al. . |
| 5,591,664 | 1/1997 | Wang et al. ............................. 437/60 |
| 5,604,146 | 2/1997 | Tseng ...................................... 437/52 |
| 5,608,247 | 3/1997 | Brown .................................... 257/306 |
| 5,631,804 | 5/1997 | New . |

(List continued on next page.)

FOREIGN PATENT DOCUMENTS 4-99317   3/1992   Japan .

*Primary Examiner*—Bruce Breneman
*Assistant Examiner*—Alan Olsen
*Attorney, Agent, or Firm*—Knobbe, Martens, Olson & Bear LLP

[57] ABSTRACT

A wafer fabrication system and method improves the structural integrity of capacitor structures. The wafer fabrication system contains an etching area and a deposition area which are connected with a common vacuum. In the etching area, the support material surrounding the bottom electrode of a stacked capacitor is removed with vapor etching techniques. The exposed bottom electrode of the stacked capacitor is then robotically transferred within the common vacuum to the deposition area where a dielectric layer is applied to the exposed bottom electrode.

17 Claims, 4 Drawing Sheets

U.S. PATENT DOCUMENTS

| | | | |
|---|---|---|---|
| 5,661,064 | 8/1997 | Figura et al. | 438/396 |
| 5,663,093 | 9/1997 | Tseng et al. | 439/396 |
| 5,665,624 | 9/1997 | Hong | 438/244 |
| 5,698,989 | 12/1997 | Nulman | 324/719 |
| 5,712,202 | 1/1998 | Liaw et al. | 438/253 |
| 5,723,373 | 3/1998 | Chang et al. | 438/253 |
| 5,726,086 | 3/1998 | Wu | 438/253 |
| 5,733,808 | 3/1998 | Tseng | 438/239 |
| 5,733,809 | 3/1998 | Dennison et al. | 438/253 |
| 5,759,888 | 6/1998 | Wang et al. | 428/239 |
| 5,760,434 | 6/1998 | Zahurak et al. | 257/309 |
| 5,763,286 | 6/1998 | Figura et al. | 437/60 |
| 5,770,500 | 6/1998 | Batra et al. | 438/255 |
| 5,770,510 | 6/1998 | Lin et al. | 438/396 |
| 5,792,693 | 8/1998 | Tseng | 438/254 |
| 5,795,355 | 8/1998 | Moran | 29/25.01 |

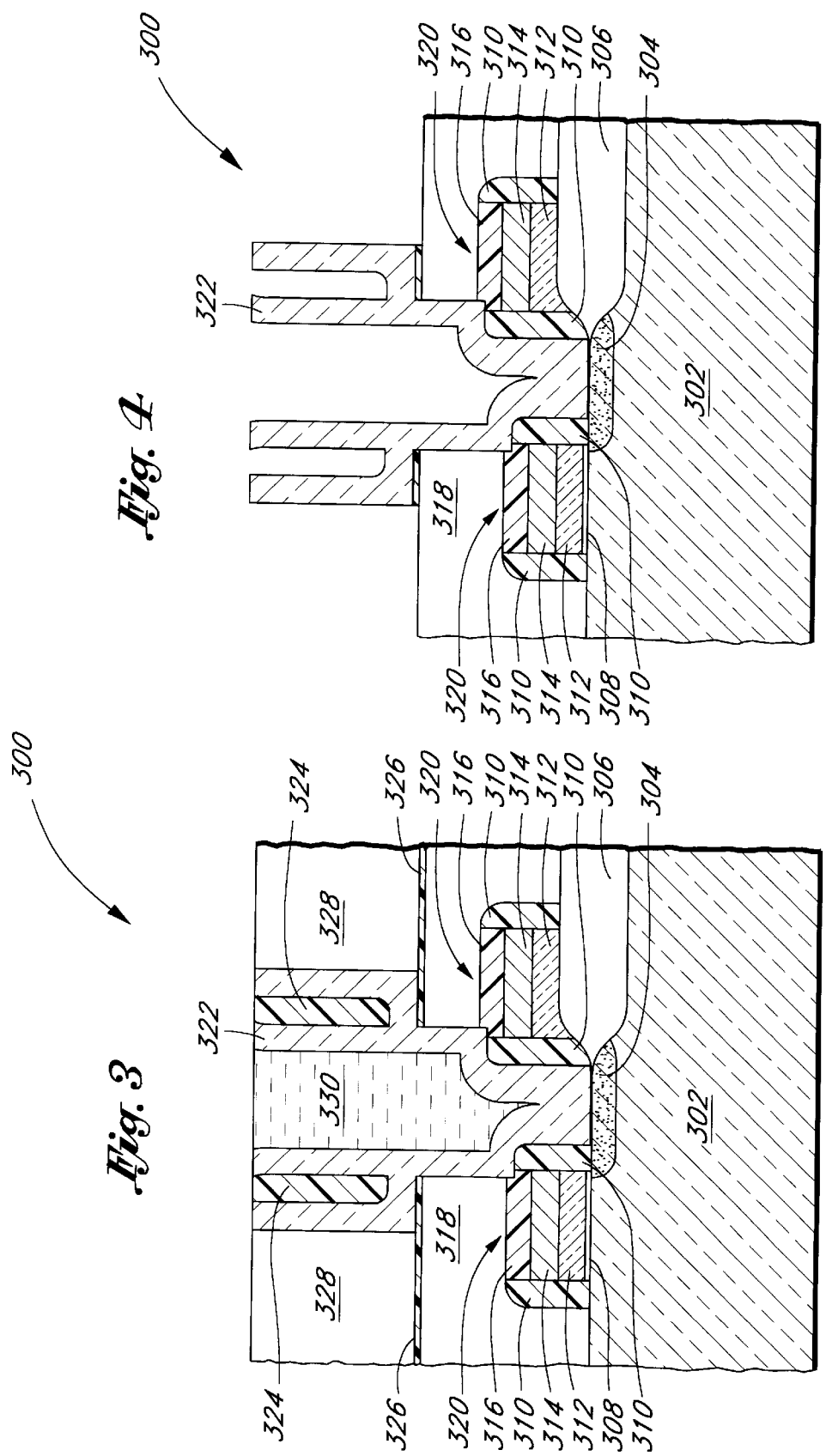

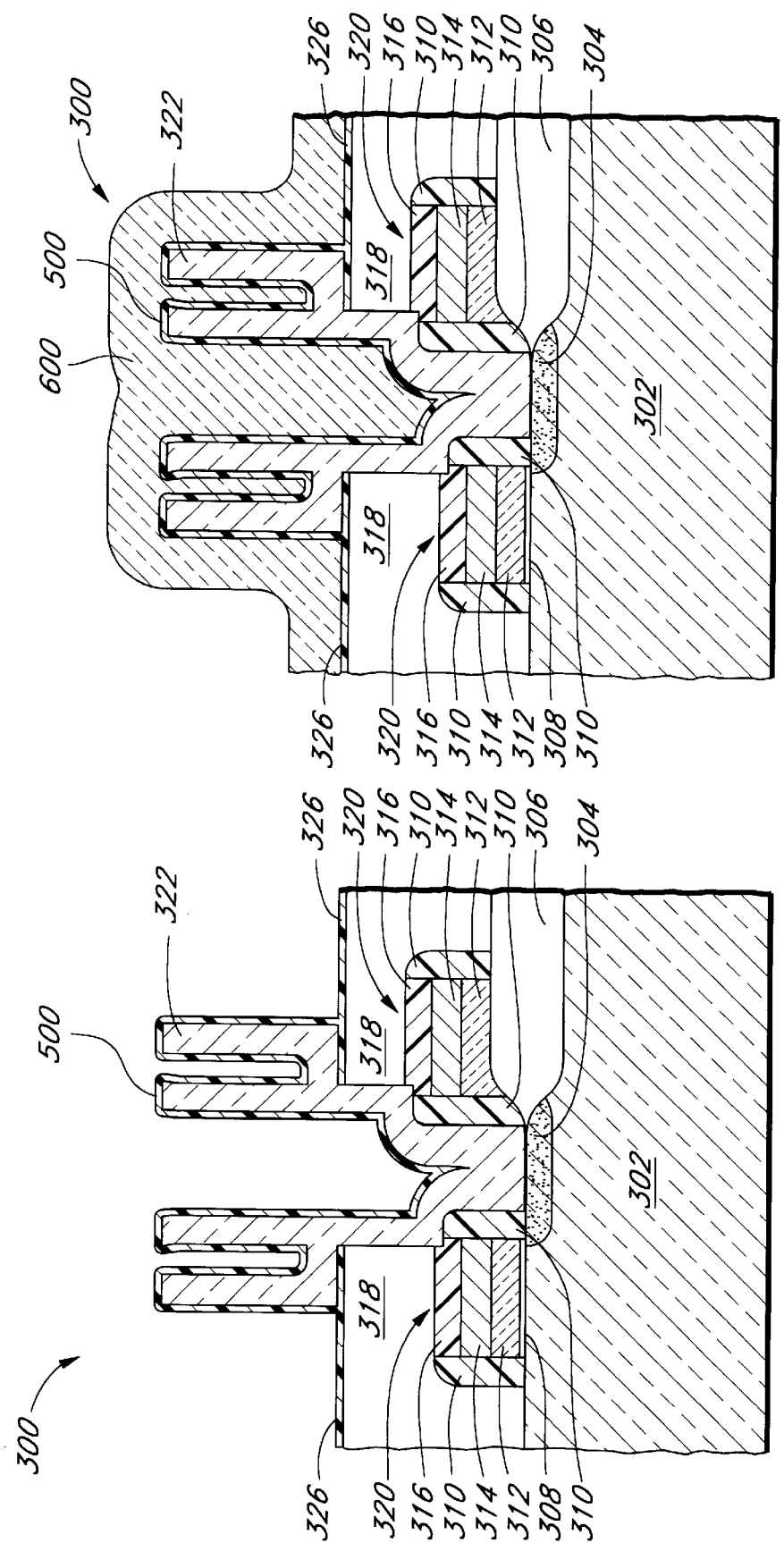

METHOD AND APPARATUS FOR IMPROVING THE STRUCTURAL INTEGRITY OF STACKED CAPACITORS

FIELD OF THE INVENTION

This invention relates to capacitors used in integrated circuits, and more particularly, to the fabrication of three-dimensional stacked capacitors for high density random access memory arrays.

BACKGROUND OF THE INVENTION

Most current-generation dynamic random access memory circuits comprise arrays of memory cells, each memory cell containing two main components: a field effect transistor and a capacitor. Broadly speaking, the transistor acts like a switch and the capacitor acts like a storage battery. When switched on, the transistor supplies a current which charges the capacitor. The charge stored in the capacitor is then used to represent a data value.

Because the charge stored in the capacitor represents a data value, the capacitor must be able to store a certain minimum charge to ensure reliable operation of the memory cell. With recent advances in the miniaturization of integrated circuits, however, it has become more difficult to build capacitors large enough to store such a minimum charge. Consequently, manufacturers of dynamic random access memory circuits have attempted to increase the total charge capacity of a memory cell capacitor without significantly affecting the chip area occupied by the memory cell. Such techniques concentrate on increasing the effective surface area of the capacitor by creating three-dimensional structures which increase the effective surface area of the capacitor while better utilizing available space.

One method of increasing a capacitor's storage size in densely packed memory devices is to use "stacked capacitor" designs. Stacked capacitor designs use the space existing over the memory cell to create a high-aspect-ratio, three-dimensional capacitor. For example, stacked capacitor designs can include container-within-container structures or multiple cylindrical structures. Fabrication of such structures, however, requires a variety of complex processes, including multiple mask, deposition, and etching steps.

For instance, a paper submitted by J. H. Ahn, et al., entitled "Micro Villus Patterning (MVP) Technology for 256 MbDRAM Stack Cell," 1992 IEEE, 1992 Symposium on VLSI Technology Digest of Technical Papers, pp. 12–13, which is hereby incorporated herein by reference, discusses micro villus patterning technology to develop a three-dimensional stacked capacitor having villus bars. This micro villus patterning technology, however, may result in splintering or slivering problems.

For example, the three-dimensional villus bars may deform or splinter creating a short in an adjacent memory cell, which renders the adjacent memory cell unusable. Furthermore, when using a spherical-grain polysilicon, the variable grain sizes can produce structures having diameters smaller than 0.010 micrometers. Consequently, such structures are more susceptible to breaking and splintering. U.S. Pat. No. 5,340,763, issued Aug. 23, 1994 to Dennison, which is hereby incorporated herein by reference, discloses one method of forming stacked capacitors while minimizing or containing the damage caused by such breakage.

Furthermore, the three-dimensional capacitor structures are more susceptible to breakage during particular processing steps. In general, three-dimensional capacitor structures include a bottom electrode layer, a dielectric layer and a top electrode layer. The bottom electrode layer is formed within what is called a "sacrificial mould." The sacrificial mould (or mold) is a structural layer which provides support for and defines the shape of the bottom electrode layer.

Once the sacrificial mold is removed, such as during a wet etch process step, a dielectric layer and a second electrode layer are then deposited onto the three-dimensional electrode. Thus, after the removal of the sacrificial mold, the fragile three-dimensional bottom electrode layer is exposed until the deposition of the dielectric layer and top electrode. As a result, the bottom electrode layer often breaks and splinters when subjected to external vibrations and forces.

Furthermore, in conventional systems, at the end of a wet etching step, the memory cells are spin dried in a centrifuge. The resulting centrifugal forces placed on the memory cell tends to further break and damage the exposed electrode layer. In addition, inter-chamber transportation of the exposed electrode layer from the wet etch process step to the dielectric deposition step can subject the exposed electrode layer to external vibrations which further damage and break the fragile structure of the electrode.

Accordingly, manufacturers of three-dimensional stacked capacitors need a cost-effective and delicate system which reduces the amount of breakage and splintering which occurs when forming three-dimensional stacked capacitors.

SUMMARY OF THE INVENTION

In accordance with one aspect of the present invention, an enhanced system and method for reducing structural integrity problems induced by the handling of fragile three-dimensional stacked capacitor structures is disclosed. The system integrates "in-situ" etch techniques with "in-situ" dielectric deposition techniques to minimize external stresses and vibrations. In the preferred embodiment, the semiconductor fabrication device contains a common transfer area so that a semiconductor wafer can be transferred subject to a controlled atmospheric pressure when moving from one processing area to another. This is often referred to as "in-situ" since the semiconductor wafers never leaves the controlled environment of one machine.

Furthermore, the in-situ integration of the etch techniques with the deposition techniques allows the use of robotic handling which minimizes external vibrations. Still further, the etch techniques utilize vapor etching instead of wet etching. These vapor etching techniques reduce the external stresses placed on the semiconductor wafer. Advantageously, a stacked capacitor memory cell processed with one embodiment of the present invention is not subjected to the centrifugal forces of spin drying after a wet etch. In addition, because the capacitors are no longer subjected to the forces associated with centrifugal drying, the in-situ etch techniques of one embodiment of the present invention allows the fabrication of thinner three-dimensional capacitor structures with greater surface areas. Such thinner three-dimensional structures further enhance the surface area the three-dimensional stacked capacitor structures allowing further reduction in memory cell sizes.

In one aspect of the invention, a semiconductor fabrication device is provided which includes an etching area and a deposition area which are connected with a common atmospheric pressure. Using this device, a semiconductor substrate having a conductive structure formed within a sacrificial mould is first located in the etching area. The etching area uses vapor etching techniques to remove a portion of the sacrificial mould and expose a portion of the conductive layer. The semiconductor substrate is then transferred to the deposition area. In the deposition area, a dielectric layer is formed upon the exposed conductive layer.

In another aspect of the invention, a semiconductor etching device and a semiconductor deposition device are provided. In addition, a semiconductor substrate having a conductive electrode contained within a support material is provided. Within the semiconductor etching device, a portion of the support material is etched from the semiconductor substrate to expose a portion of the conductive electrode. The semiconductor substrate with the exposed conductive electrode is then robotically transferred to the semiconductor deposition device. The semiconductor deposition device then adds a layer of material upon the exposed conductive layer.

BRIEF DESCRIPTION OF THE DRAWINGS

These and other aspects, advantages and novel features of the invention will become apparent upon reading the following detailed description and upon reference to the accompanying drawings in which:

FIG. 3 illustrates a cross-sectional view of a partially fabricated memory cell having a bottom electrode of a stacked capacitor supported by a structural layer;

FIG. 4 illustrates a cross-sectional view of the partially fabricated memory cell after the in-situ etching step of the preferred embodiment removes the sacrificial mould and exposes a three-dimensional electrode;

FIG. 5 is a cross-sectional view of a partially fabricated memory cell after the in-situ deposition step of the preferred embodiment deposits a dielectric layer on the exposed three-dimensional electrode; and FIG. 6 is a cross-sectional view of a partially fabricated memory cell after a deposition step of the preferred embodiment deposits a top electrode on the dielectric layer.

Figure 1:
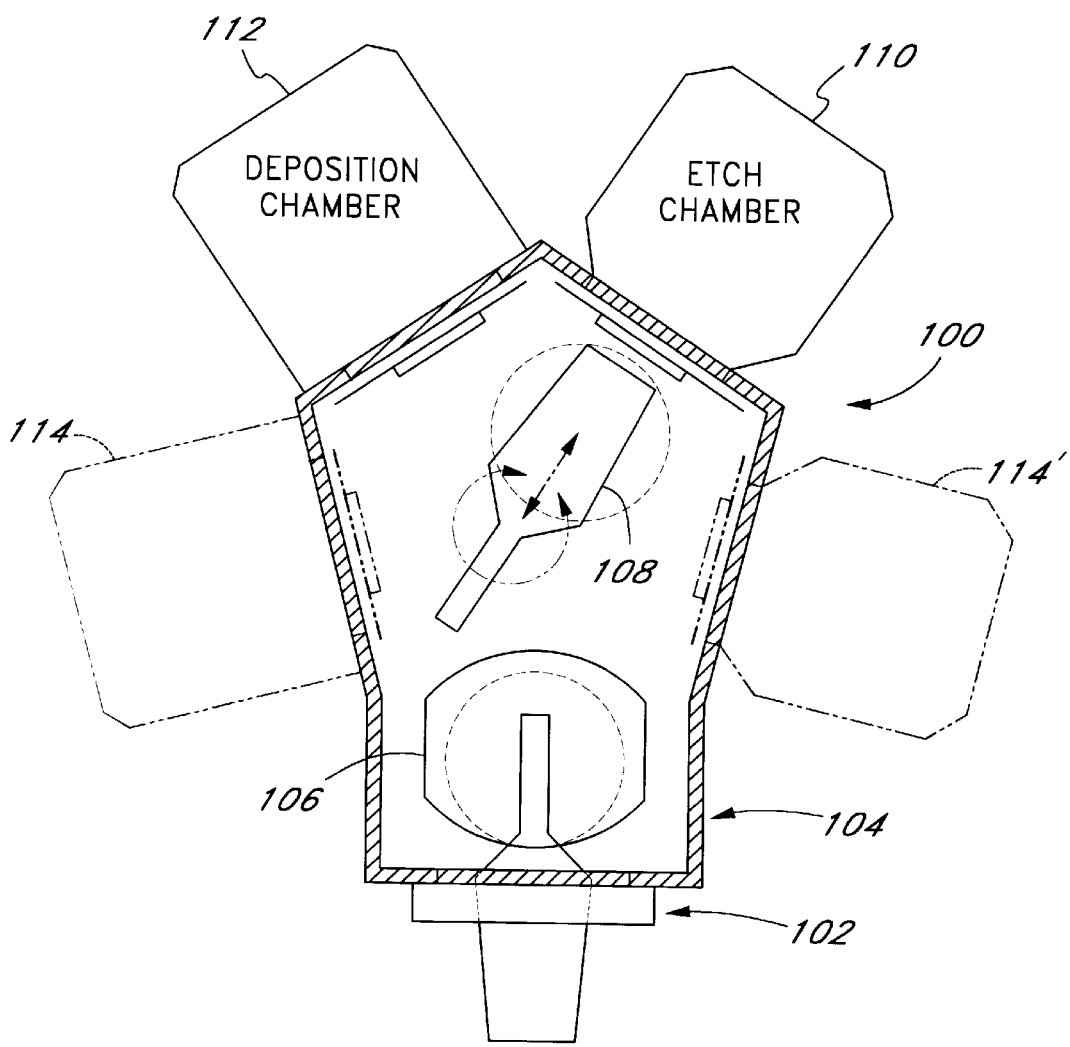
FIG. 1 is a block diagram illustrating a multi-chamber device which can perform an etch process step in one chamber and a deposition process step in another chamber.

In the drawings, the first digit of any three-digit number indicates the number of the figure in which the element first appears. For example, an element with the reference number 402 first appears in FIG. 4.

DETAILED DESCRIPTION OF THE PREFERRED EMBODIMENT

Although the present description focuses on the context of a dynamic random access memory cell, it will be understood that the present invention may have utility in many applications for conductive structures where high surface areas are desired. In particular, the invention has broad utility where three-dimensional structures are created through etching processes.

Referring now to FIG. 1, an example of a multi-chamber device 100 is shown. The multi-chamber device 100 includes a cassette input/output port 102, a load lock chamber 104, a storage elevator 106, a robot 108, an etch chamber 110, a deposition chamber 112 and expansion chambers 114. In the preferred embodiment, the load lock chamber 104 maintains a vacuum.

The cassette input/output port 102 allows the loading of semiconductor substrates or wafers into and the removal of semiconductor wafers from the multi-chamber device 100.

Coupled to the cassette input/output port 102 is the storage elevator 106. Once the semiconductor wafers are loaded into the multi-chamber device, the storage elevator 106 often stores the semiconductor wafers between processing steps. The robot 108 transfers the semiconductor wafers among the storage elevator, the expansion chambers 114, the etch chamber 110 and the deposition chamber 112. Use of the robot 108 minimizes the external forces applied to the semi-conductor wafers and allows movement of the semiconductor wafers within the vacuum of the load lock chamber 104.

In one embodiment of the present invention, the multi-chamber device 100 is configured to perform an etching step in the etch chamber 110, a deposition step in the deposition chamber 112 and other processing steps in the expansion chambers 114. In the preferred embodiment, the load lock chamber 104 acts as a common transfer area. One of ordinary skill in the art, however, will appreciate that any of a variety of commercially available semiconductor processing devices can be used as the multi-chamber device 100. For example, separate etch devices and deposition devices could also be connected with a transfer chamber which allows robotic transfer of the semiconductor wafer from one chamber to another chamber.

Figure 2:
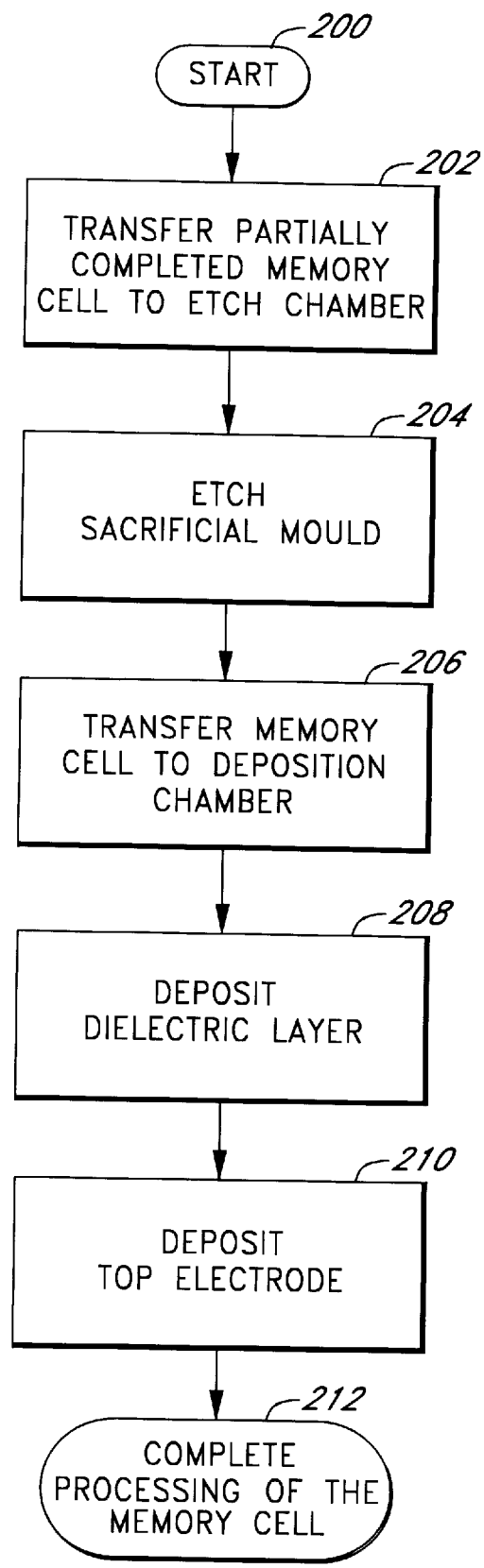
FIG. 2 is a flow chart illustrating the process steps of the preferred embodiment of the present invention.

Referring now to FIG. 2, a high level flow chart illustrates the processing steps in the preferred embodiment of the present invention. In a start state 200, a partially completed memory cell is provided. The partially completed memory cell typically contains a field effect transistor and the bottom electrode of a stacked capacitor. In the preferred embodiment, the bottom electrode of the stacked capacitor is encased in a sacrificial mould. The sacrificial mould comprises the support materials that form and protect the bottom electrode during fabrication of the semiconductor wafer. In the preferred embodiment, the sacrificial mould encapsulates the bottom electrode of a three-dimensional stacked capacitor.

Proceeding to state 202, the robot 108 transfers the partially completed memory cell from either the storage elevator 106 or the expansion cambers to the etch chamber 110. Proceeding to state 204, the etch chamber 110 uses vapor etch techniques as is discussed in more detail below, which remove a portion of the sacrificial layer. Accordingly, the vapor etch in state 204 exposes a portion of the three-dimensional bottom electrode. An advantage of the vapor etch in state 204 is that it replaces the wet etching techniques used in the prior art. As a result, the delicate three-dimensional bottom electrode is not subjected to the centrifugal forces associated with spin drying.

Proceeding to state 206, the robot 108 transfers the semiconductor wafer with its exposed three-dimensional bottom electrode to the deposition chamber 112. Use of the robot 108 advantageously reduces the external forces associated with human handling of the semiconductor wafer. Furthermore, because the load lock chamber 104 maintains a vacuum, the stresses associated with subjecting the exposed electrode to different pressures are reduced.

Proceeding to state 208, the deposition chamber 112 deposits a dielectric layer on the exposed electrode. As is discussed in more detail below, the dielectric layer comprises a wide variety of materials which can be deposited using a wide variety of techniques.

Proceeding to state 210, the deposition chamber 112 also deposits a top electrode on the dielectric layer. The top electrode, dielectric layer and bottom electrode form the stacked capacitor. Alternatively, in state 210 the semiconductor wafer can be transferred to one of the expansion chambers 114 where the top electrode is then deposited on the dielectric layer.

Proceeding to state 212, the three-dimensional stacked capacitor can be completed with conventional process steps.

The processing steps of the preferred embodiment of the present invention will now be discussed in further detail and with respect to an exemplary polished or planarized memory cell. A partially complete, planarized memory cell 300 is illustrated in FIG. 3. While the present invention is described with respect to the preferred embodiment, a person of ordinary skill in the art will recognize that a wide variety of three-dimensional fabrication techniques can be enhanced with the processing steps of the present invention. For instance, the stacked capacitor fabrication techniques described in U.S. Pat. No. 5,362,666 which is hereby incorporated herein by reference, can be enhanced with the processing steps of the present invention.

In the preferred embodiment, the memory cell 300 comprises a substrate 302, an active area 304, a thick field oxide 306, a thin gate oxide 308, vertical dielectric spacers 310, a polysilicon layer 312, a tungsten silicide layer 314, word line insulating caps 316, an insulating layer 318, a bottom electrode 322, side wall spacers 324, an etch stop film 326, a structural layer 328 and filler material 330.

Typically when fabricating the memory cell, a pair of word lines 320 are formed over the substrate 302 on either side of the active area 304. Each of the word lines 320 include the polysilicon layer 312 and the tungsten silicide layer 314. Each of the word lines 320 is further isolated by the vertical dielectric spacers 310, the word line insulating caps 316, and the insulating layer 318. The word lines 320 are separated from the substrate 302 by either the thin gate oxide 308 or the thick field oxide 306.

The vertical dielectric spacers 310 and the word line insulating caps 316 preferably comprise silicon nitride ($Si_3N_4$). The insulating layer 318 comprises a variety of dielectric materials including oxides, nitriles, and preferably, borophosphosilicate glass. The word lines 320 in currently produced dynamic random access memory are usually spaced less than 0.35 microns a part, while future generation dynamic random access memories are expected to be spaced less than 0.25 microns a part.

Layered on top of the active area 304 and located between the pair of word lines 320 is the bottom electrode 322. The bottom electrode 322 forms the three-dimensional, double cylindrical structure of the stacked cell capacitor. FIG. 3, provides a cross-sectional view of the bottom electrode such that the double cylindrical shape of the stacked capacitor appears as multiple prongs. The three-dimensional structure advantageously provides a high surface area which, in turn, leads to higher capacitance for the memory cell. The bottom electrode 322 preferably comprises polysilicon having a thickness between 200 angstroms and 500 angstroms.

In the memory cell 300 of the preferred embodiment, the etch stop film 326 is layered above the insulating layer 318. Preferably, the etch stop film 326 is about 100 angstroms thick. A thick structural layer 328 is layered above the etch stop film 326. The etch stop film 326 and the structural layer 328 are deposited by using known chemical vapor deposition techniques to achieve optimal conformity though such deposition techniques are not critical to the present invention.

The composition of the etch stop film 326 and the thick structural layer 328 is chosen, such that the structural layer 328 may be etched selectively against the etch stop film 326.

For example, the preferred material for the etch stop film 326 is silicon nitrile, while the structural layer 328 comprises borophosphosilicate glass (BPSG). Thus, in the preferred embodiment, the structural layer 328 is etched at a faster rate than the etch stop film 326.

In the preferred embodiment, the etch stop film 326 is formed by a reacting dichlorosilane ($SICl_2H_2$) and ammonia ($NH_3$). This reaction is discussed in Wolf and Tauber, "Silicon Processing for the VLSI Era: Volume 1—Process Technology," page 193, Lattis Press 1986, discussion of which is hereby incorporated herein by reference. A person of ordinary skill in the art, however, will understand that the etch stop film 326 is not critical and its function may be replaced with carefully time-controlled etches.

In addition, the bottom electrode 322 of the memory cell 300 is generally in the shape of two concentric cylinders which contact each other and the active area 304. Typically, the outside diameter of the innermost cylinder of the bottom electrode 322 is greater than the spacing between the word lines 320. The bottom electrode is preferably formed by a chemical vapor deposition process comprising a silicon source such as silane ($SiH_4$), and a phosphorous source, such as phosphene ($PH_3$). In the preferred embodiment, the width of the bottom electrode 322 layer ranges between about 200 angstroms and 500 angstroms.

In the center of the bottom electrode is the filler material 330. The filler material 330 provides structural support which helps prevent breakage. Preferably, the filler material 330 comprises a conventional photoresist, which flows easily into the narrow center of the bottom electrode 322. Between each of the cylindrical shapes of the bottom electrode 322 exists the side wall spacers 324. The material of the side wall spacers 324 comprises silicon nitride ($Si_3N_4$). In addition, the side wall spacers 324 are usually thicker than the thickness of any one villus bar of the bottom electrode 322. Preferably, the side wall spacers 324 are about 500 angstroms thick.

In the preferred embodiment, the top of the memory cell 300 has been polished or planarized to remove the portion of the filler material 330 and structural layer 328 which overflow the double cylindrical shape of the bottom electrode 322. The polishing or planarization of the memory cell 300 uses conventional chemical mechanical planarization process (CMP), most preferably using an ammonia and silica based slurry. The remaining structural layer 328, the side wall spacers 324, and the filler material 330 are often referred to as the sacrificial mould.

Referring now to the flow chart in FIG. 2, proceeding from the start state 200 to state 202, the preferred embodiment of the present invention transfers the partially completed memory cell 300 to the etch chamber 110. Proceeding to state 204, the structural layer 328, the side wall spacers 324, and the filler material 330 are removed to expose the bottom electrode 322 as illustrated in FIG. 4. The sequence of etching these layers is not critical.

In the preferred sequence, the filler material 330 is removed by conventional resist stripping. The structural layer 328 and the side wall spacer 600 are removed with conventional vapor etching techniques. For example, a selective wet oxide etch such as a dilute hydrofluoric acid (HF) solution etches the structural layer 328. In other embodiments, the borophosphosilicate (BPSG) glass (BPSG) of the structural layer 328 can be etched with Freon 23 ($CHF_3$) and oxygen ($O_2$) where the oxygen ($O_2$) flow rate is less than 5% oxygen by volume in a Freon 23 ($CHF_3$) and oxygen ($O_2$) mixture. Alternatively, the combination of Freon 14 ($CF_4$), Argon (Ar) and Freon 23 ($CHF_3$) can be used to etch the borophosphosilicate glass (BPSG).

The silicon nitride side wall spacers 324, on the other hand, can be etched with hot phosphoric acid ($H_3PO_4$). An alternative etch of the nitride side wall spacers includes a fluorine-based plasma etch.

The wafer should be etched for enough time to remove the structural layer 328 down to the etch stop film 326. Since etch rates are well known for different etchants, it will be readily apparent to one of skill in this art how much time is necessary to remove the filler material 330, the side wall spacers 324 and the structural layer 328.

After the etching of the sacrificial mode in state 204 is complete, the preferred embodiment proceeds to state 206, where the etched memory cell 300 is transferred to the deposition chamber 112. As shown in FIG. 4, after etching the sacrificial mould, the double cylindrical structure of the bottom electrode 322 extends above the structural layer. As explained above, the exposed bottom electrode 322 is highly fragile and susceptible to breakage. In state 206, the robot 108 transfers the etched memory cell 300 to the deposition chamber 112. Use of the robot 108 greatly reduces external vibrations.

In the preferred embodiment, the robot 108 is controlled with a conventional software program which directs the speed, acceleration and movement of the robot 108. The robot 108 minimizes forces associated with acceleration of the semiconductor wafer and the forces associated with changes in the angle of the semiconductor wafer. In addition, the robot 108 minimizes the vibrations associated with clasping and releasing the semiconductor wafers.

Proceeding to state 210, the deposition chamber 112 uses known deposition techniques to deposit other layers on the exposed bottom electrode 322 such as a dielectric layer and top electrode. Those of ordinary skill in the art will also understand that the bottom electrode 322 may also be supplemented in alternative embodiments with a rough silicon layer. For example, the rough silicon layer could include hemispherical grain (HSG) silicon. Hemispherical grain silicon or other rough conductive layers could thus further increase the surface area of the bottom electrode 322.

Referring now to FIG. 5, the preferred embodiment deposits a dielectric layer 500 on the exposed bottom electrode 322. The dielectric layer 500 is deposited using conventional techniques. Preferably, the dielectric layer 500 preferably comprises an oxide-nitride-oxide composite (ONO) between about 150 angstroms and 200 angstroms. Proceeding to state 210, the deposition chamber 112 also uses conventional techniques to layer the top electrode 600 on the dielectric layer 500 as illustrated in FIG. 6. Preferably, the top electrode 600 comprises polysilicon and may be as thick as 3,000 angstroms or greater. In the preferred embodiment, the top electrode 600 acts as a common reference electrode for the dynamic random access memory.

While the above detailed description has shown, described, and pointed out the fundamental novel features of the invention as applied to a preferred embodiment, it will be understood that various omissions and substitutions and changes in the form and details in the illustrated device and method may be made by those skilled in the art without departing from the spirit of the invention. Consequently, the scope of the invention should not be limited to the foregoing discussion and should be defined by the appended claims.

What is claimed is:

1. A process for fabricating a conductive structure comprising the acts of:

providing an etching area and a deposition area within a semiconductor fabrication device;

providing a semiconductor substrate in said etching area, said semiconductor substrate having a conductive structure formed within a sacrificial mould, wherein said sacrificial mould is around and within at least a portion of said conductive structure so as to reduce any vibrations applied to said conductive structure;

vapor etching said sacrificial mould in said etching area to expose a portion of said conductive structure; and transferring said semiconductor substrate to said deposition area while subjecting said semiconductor substrate to a controlled pressure so as to reduce any oxidation applied to said semiconductor substrate.

2. The process of claim 1 further comprising the act of depositing a layer of dielectric material on said exposed portion of said conductive structure.

3. The process of claim 2 further comprising the act of depositing a conductive layer on said dielectric layer.

4. The process of claim 1 wherein said etching area and said deposition area are part of an in-situ semiconductor fabrication device.

5. The process of claim 1 wherein said conductive structure is an electrode in a stacked capacitor.

6. The process of claim 1 wherein said conductive structure is shaped to form a cylindrical structure.

7. The process of claim 1 wherein said conductive structure is shaped to form three-dimensional villus bars.

8. The process of claim 1 wherein said transferring act transfers said substrate with a robotic device.

9. A process for fabricating a three-dimensional capacitor structure comprising the acts of:

providing a semiconductor substrate having a first conductive electrode contained within a support material, wherein said support material is around and within at least a portion of said first conductive electrode so as to reduce any vibrations applied to said first conductive electrode;

providing a semiconductor etching device;

providing a semiconductor deposition device;

providing a transfer chamber, wherein said semiconductor deposition device and said semiconductor etching device are connected to said transfer chamber, and wherein said transfer chamber maintains a vacuum;

etching said support material in said semiconductor etching device to expose a portion of said first conductive electrode; and robotically transferring within said transfer chamber, said semiconductor substrate from said semiconductor etching device to said semiconductor deposition device, so as to reduce any oxidation applied to said semiconductor substrate.

10. The process of claim 9 wherein said conductive electrode forms a three-dimensional stacked capacitor.

11. The process of claim 9 further comprising the act of depositing a layer of material on said conductive electrode with said semiconductor deposition device.

12. The process of claim 11 wherein said act of depositing deposits a layer of dielectric material on said conductive electrode.

13. The process of claim 12 further comprising the act of depositing a second electrode on said layer of dielectric material.

14. A process for fabricating a conductive structure comprising the acts of:

providing a semiconductor substrate having a conductive structure, wherein said conductive structure has an inside and an outside;

providing a structural layer supporting the outside of said conductive structure;

providing a filler layer supporting the inside of said conductive structure;

providing an etching area and a deposition area within a semiconductor fabrication device;

transferring said semiconductor substrate into said etching area, wherein the structural layer and the filler layer reduce vibrations applied to the semiconductor substrate;

vapor etching said structural layer and said filler layer in said etching area to expose the inside and the outside of said conductive structure;

transferring said semiconductor substrate to said deposition area while subjecting said semiconductor substrate to a controlled pressure.

15. A process for fabricating a conductive structure, comprising the acts of:

providing an etching area and a deposition area; and reducing vibrational stress and oxidation on a semiconductor substrate by the acts of:

providing a supporting structure on an inside and outside of a conductive structure of said semiconductor substrate;

transferring said semiconductor substrate into said etching area;

vapor etching said supporting structure to expose the inside and outside of said conductive structure;

maintaining a controlled pressure during a mechanical transfer of said semiconductor substrate from the etching area to the deposition area;

providing at least one additional supporting layer on said conductive structure; and transferring said semiconductor substrate from said deposition area.

16. The process of claim 15 wherein the conductive structure comprises at least two concentric cylinders.

17. The process of claim 16 further comprising the act of providing a side wall spacer between said concentric cylinders and vapor etching said side wall spacer to expose the interior of the concentric cylinders.

* * * * *